(12) United States Patent
Petersen et al.

(10) Patent No.: US 10,342,082 B2
(45) Date of Patent: Jul. 2, 2019

(54) LINEAR LIGHTING WITH DISTRIBUTED POWER CONVERSION AND REDUCED FLICKER

(71) Applicant: Elemental LED, Inc., Reno, NV (US)

(72) Inventors: Russell Petersen, Alameda, CA (US);
Steven W. Gensler, San Jose, CA (US);
Rick Stellmacher, Silver Springs, NV (US)

(73) Assignee: Elemental LED, Inc., Reno, NV (US)

( * ) Notice: Subject to any disclaimer, the term of this patent is extended or adjusted under 35 U.S.C. 154(b) by 0 days.

(21) Appl. No.: 16/012,592

(22) Filed: Jun. 19, 2018

(65) Prior Publication Data
US 2018/0302965 A1    Oct. 18, 2018

Related U.S. Application Data

(63) Continuation of application No. 15/675,518, filed on Aug. 11, 2017, now Pat. No. 10,028,345, which is a
(Continued)

(51) Int. Cl.
*H05B 37/02* (2006.01)
*F21S 4/22* (2016.01)
(Continued)

(52) U.S. Cl.
CPC ............ *H05B 33/0827* (2013.01); *F21S 4/22* (2016.01); *F21V 23/005* (2013.01); *F21V 23/06* (2013.01);
(Continued)

(58) Field of Classification Search
CPC ... H05B 33/0827; H05B 33/0809; F21S 4/22; F21V 23/005; F21V 23/06; H05K 1/189;
(Continued)

(56) References Cited

U.S. PATENT DOCUMENTS

| 3,670,290 A | 6/1972 | Angele et al. |
| 4,738,263 A | 4/1988 | Seebach et al. |

(Continued)

FOREIGN PATENT DOCUMENTS

| CN | 101135422 A | 3/2008 |
| CN | 203797441 U | 8/2014 |
| CN | 204100003 U | 1/2015 |

OTHER PUBLICATIONS

European Patent Office, Search Report and Written Opinion for PCT/2017/035196, dated Jul. 20, 2017.
(Continued)

*Primary Examiner* — Daniel D Chang
(74) *Attorney, Agent, or Firm* — United IP Counselors, LLC

(57) ABSTRACT

A strip of linear lighting with distributed power conversion is disclosed. The linear lighting includes a flexible PCB. The flexible PCB is divided into repeating blocks, which are arranged electrically in parallel with one another between power and ground. Each repeating block includes power conversion and conditioning circuits. A plurality of LED light engines are connected to the outputs of the power conversion and conditioning circuits, electrically in series with one another. The power conversion and conditioning circuits typically include at least a full-bridge rectifier, and a filter may be connected to each of the LED light engines. A pair of conductors run the length of the PCB adjacent to it and are connected to each of the repeating blocks. A flexible, transparent covering surrounds the PCB and pair of conductors.

14 Claims, 9 Drawing Sheets

Related U.S. Application Data continuation-in-part of application No. 15/409,101, filed on Jan. 18, 2017, now Pat. No. 9,784,421.

(60) Provisional application No. 62/344,670, filed on Jun. 2, 2016.

(51) Int. Cl.

| | | |
|---|---|---|
| *F21V 23/00* | (2015.01) | |
| *F21V 23/06* | (2006.01) | |
| *H05B 33/08* | (2006.01) | |
| *H05K 1/18* | (2006.01) | |
| *F21Y 115/10* | (2016.01) | |
| *F21Y 105/10* | (2016.01) | |
| *H05K 1/03* | (2006.01) | |
| *F21V 23/02* | (2006.01) | |
| *F21Y 103/10* | (2016.01) | |

(52) U.S. Cl.
CPC ......... *H05B 33/0809* (2013.01); *H05K 1/189* (2013.01); *F21V 23/02* (2013.01); *F21Y 2103/10* (2016.08); *F21Y 2105/10* (2016.08); *F21Y 2115/10* (2016.08); *H05K 1/0393* (2013.01); *H05K 2201/0145* (2013.01); *H05K 2201/1006* (2013.01); *H05K 2201/10106* (2013.01); *H05K 2201/10522* (2013.01); *Y02B 20/348* (2013.01)

(58) Field of Classification Search
CPC ......... H05K 1/0393; H05K 2201/0145; H05K 2201/1006; H05K 2201/10106; H05K 2201/10522; F21Y 2105/10; F21Y 2115/10
USPC ........................................................ 315/192
See application file for complete search history.

(56) References Cited

U.S. PATENT DOCUMENTS

| | | | |
|---|---|---|---|
| 4,768,969 A | 9/1988 | Bauer et al. | |
| 4,952,177 A | 8/1990 | Drake et al. | |
| 5,442,258 A | 8/1995 | Shibata | |
| 6,000,951 A | 12/1999 | Hansen et al. | |
| 6,283,612 B1 | 9/2001 | Hunter | |
| 7,175,303 B2 | 2/2007 | Kovacik et al. | |
| 7,473,006 B1 | 1/2009 | Bollman | |
| 8,093,823 B1 | 1/2012 | Ivey et al. | |
| 8,231,261 B2 | 7/2012 | Gherardini et al. | |
| 8,714,772 B1 | 5/2014 | Levante et al. | |
| 8,754,588 B2 | 6/2014 | Minaki et al. | |
| 8,979,296 B2 | 3/2015 | Wiemer et al. | |
| 9,004,716 B2 | 4/2015 | Ai | |
| 9,206,964 B2 | 12/2015 | Marsh et al. | |
| 9,239,136 B1 | 1/2016 | Petersen et al. | |
| 9,341,359 B1 | 5/2016 | Fernandez et al. | |
| 9,374,856 B2 | 6/2016 | Winton | |
| 9,491,821 B2 | 11/2016 | Shackle | |
| 9,509,110 B1 | 11/2016 | Buck et al. | |
| 9,671,075 B2 | 6/2017 | Greene | |
| 9,746,144 B1 | 8/2017 | Greene | |
| 2002/0106931 A1 | 8/2002 | Hsien-Te | |
| 2007/0153508 A1 | 7/2007 | Nall et al. | |
| 2010/0008090 A1 | 1/2010 | Li et al. | |
| 2012/0002417 A1 | 1/2012 | Li | |
| 2012/0146525 A1 | 6/2012 | Hui et al. | |
| 2012/0242239 A1 | 9/2012 | Miskin et al. | |
| 2013/0249394 A1 | 9/2013 | Fay | |
| 2013/0270999 A1 | 10/2013 | Ramer et al. | |
| 2015/0077998 A1 | 3/2015 | Zhang | |
| 2015/0241035 A1 | 8/2015 | Dankelmann et al. | |
| 2015/0285472 A1 | 10/2015 | Evitt | |
| 2015/0351181 A1* | 12/2015 | Huang | H05B 33/0821 315/188 |
| 2017/0299132 A1 | 10/2017 | Greene | |

OTHER PUBLICATIONS

Jesco Lighting Group, LLC, "INFINA." Internet. Available at http://www.jescolighting.com/documents/Catalogs/DL-AC-FLEX.pdf. Sep. 2014.

Titan Micro Electronics, "Single-Channel LED Constant Current Driver Chip TM1810, Version 1.4" Internet. Available at http://www.titanmec.com/index.php/en/product/download/id/229.html. Sep. 7, 2015.

* cited by examiner

LINEAR LIGHTING WITH DISTRIBUTED POWER CONVERSION AND REDUCED FLICKER

CROSS-REFERENCE TO RELATED APPLICATIONS

This application is a continuation of U.S. patent application Ser. No. 15/675,518, filed Aug. 11, 2017, which is a continuation-in-part of U.S. application Ser. No. 15/409,101, filed Jan. 18, 2017, which claims priority to U.S. Provisional Patent Application No. 62/344,670, filed Jun. 2, 2016. The contents of all of those applications are incorporated by reference in their entirety.

BACKGROUND OF THE INVENTION

1. Field of the Invention

Generally speaking, the invention relates to light-emitting diode (LED)-based linear lighting, and more particularly, to linear lighting with distributed onboard power conversion.

2. Description of Related Art

Over the last decade, lighting based on light-emitting diodes (LEDs) has become dominant in the lighting industry, and is widely used in both residential and commercial installations. LED-based lighting has a number of advantages compared with legacy incandescent and fluorescent lighting, including high efficiency and low power draw, relatively low operating temperatures, and, with some models, selectable color and a wide variety of available color temperatures.

For most commercial and residential applications, two major types of LED-based lighting are used: bulb-type lamps and linear lighting. Bulb-type lamps are intended as direct replacements for incandescent light bulbs, typically have a shape similar to the type of bulb they are intended to replace, and are usually constructed to produce roughly the same light output as the bulbs they are intended to replace. Linear lighting is somewhat different—it usually includes a number of LEDs arranged at a regular spacing or pitch along a printed circuit board (PCB). That PCB may be rigid, made, for example, of FR4 composite, or it may be flexible, made, for example, of Mylar. In either case, the PCB usually has the form of a thin strip, although other shapes and sizes are possible.

One of the major advantages of linear lighting is its versatility. Alone, it can serve as accent lighting or task lighting, often in locations where it would be difficult to install traditional lighting fixtures. Placed in an appropriate extrusion and covered with a diffuser, it can serve as primary room lighting, replacing legacy fluorescent fixtures in offices. Properly electrically insulated and encapsulated, it can be used even in outdoor and wet locations.

In linear lighting, the individual LEDs themselves are usually packaged along with color-modifying elements, such as phosphors, and the packages may also include lensing and light-diffusing elements. LEDs used in linear lighting typically accept direct current (DC) voltages, often at low voltage levels. While the definitions of "low voltage" and "high voltage" depend on the authority one consults, for purposes of this description, voltages over about 50V will be considered to be high voltage.

Many types of linear lighting operate using low voltage DC, for example, 12-24 VDC. For example, the linear lighting disclosed in U.S. Pat. No. 9,239,136, the contents of which are incorporated by reference in their entirety, is intended to operate with low voltage DC. However, the linear lighting has an inherent voltage drop per unit length, which means that the voltage drops progressively lower as one moves from the end of the PCB where power is connected toward the far end of the PCB. Ultimately, this limits the maximum possible length of low-voltage DC linear lighting, because as the PCB gets longer, the voltage at the far end ultimately drops to a level below that needed to activate (i.e., saturate) the LEDs.

One ready solution to the problem of voltage drop in linear lighting is to increase the operating voltage. Although high-voltage AC linear lighting allows for longer runs, it comes with its own challenges. Typically, the LEDs themselves run on low-voltage DC, which means that somewhere and somehow, power must be converted from high-voltage AC to low-voltage DC to power the LEDs. The usual solution is to provide an external driver that transforms and rectifies the voltage. Drivers are often large, and are one more thing that a contractor or electrician must find room for when installing the lighting. Sometimes, placing a driver requires making a large and inconvenient hole in a wall. Better apparatus and methods for providing power for linear lighting would be useful.

Yet merely converting from AC to DC power, while necessary, may not be sufficient to provide good lighting. AC power, by definition, varies cyclically over time. Cyclical variation in power over time is not a problem for incandescent lighting, because the frequency of the AC cycle, typically 60 Hz in the United States and 50 Hz in some other countries, is too rapid to cause much perceptible variation of the light output in incandescent lighting. However, LED light engines can respond much more rapidly to changes in the incoming power. If, for example, the voltage input to an LED is cyclical or ripples over time, this can cause the LED to vary in luminance over time, or to turn on and off rapidly. Depending on the frequency involved, that can create a perceptible flicker. Commercial- and consumer-grade AC-to-DC drivers leave at least some cyclical ripple in their DC output, meaning that most commercial LED fixtures are susceptible to flicker.

Authorities have noted the potentially deleterious effects of flicker in lighting. For example, IEEE Standard 1789-2015, "IEEE Recommended Practices for Modulating Current in High-Brightness LEDs for Mitigating Health Risks to Viewers," the contents of which are incorporated by reference in their entirety, describes flicker, methods of measuring it, and recommendations for mitigating it.

SUMMARY OF THE INVENTION

One aspect of the invention relates to a strip of linear lighting with distributed power conversion. The linear lighting includes a flexible PCB. The flexible PCB is divided into repeating blocks, which are arranged electrically in parallel with one another between power and ground. Each repeating block includes power conversion and conditioning circuits. LED light engines are connected to the outputs of the power conversion and conditioning circuits, electrically in series with one another. A pair of conductors run the length of the PCB adjacent to it and are connected to each of the repeating blocks. A flexible, transparent covering surrounds the PCB and pair of conductors. The power conversion and conditioning circuits include at least a full-bridge rectifier, and may also include a capacitor or resistor-capacitor (RC) filter. Each repeating block may also include ballast resistors, current control circuits, and other elements.

Another aspect of the invention relates to a repeating block for a strip of linear lighting. The repeating block includes power conversion and conditioning circuits. LED light engines are connected to the outputs of the power conversion and conditioning circuits, electrically in series with one another. The power conversion and conditioning circuits include at least a full-bridge rectifier and a capacitive load in parallel with each LED light engine for power filtering.

Yet another aspect of the invention relates to a repeating block for a strip of linear lighting. The repeating block includes power conversion and conditioning circuits. LED light engines are connected to the outputs of the power conversion and conditioning circuits, electrically in series with one another. The power conversion and conditioning circuits include at least a full-bridge rectifier, and a capacitive load is provided in parallel with each LED light engine for power filtering. A resistive load is provided mutually in parallel with each LED light engine and each capacitive load to provide for faster power dissipation in non-steady state conditions, such as circuit power down/switch off and dimming conditions.

A further aspect of the invention relates to a repeating block for a strip of linear lighting. The repeating block includes power conversion and conditioning circuits. LED light engines are connected to the outputs of the power conversion and conditioning circuits, electrically in series with one another. The power conversion and conditioning circuits include at least a full-bridge rectifier, and a capacitive load is provided in parallel with each LED light engine for power filtering. A resistive load is provided mutually in parallel with each LED light engine and each capacitive load to provide for faster power dissipation in non-steady state conditions, such as circuit power down/switch off and dimming conditions. The power conversion and conditioning circuits also include a capacitance multiplier to smooth power provided by the full-bridge rectifier.

Other aspects, features, and advantages of the invention will be set forth in the description that follows.

BRIEF DESCRIPTION OF THE DRAWING FIGURES

The invention will be described with respect to the following drawing figures, in which like numerals represent like features throughout the figures, and in which.

DETAILED DESCRIPTION

Figure 1:
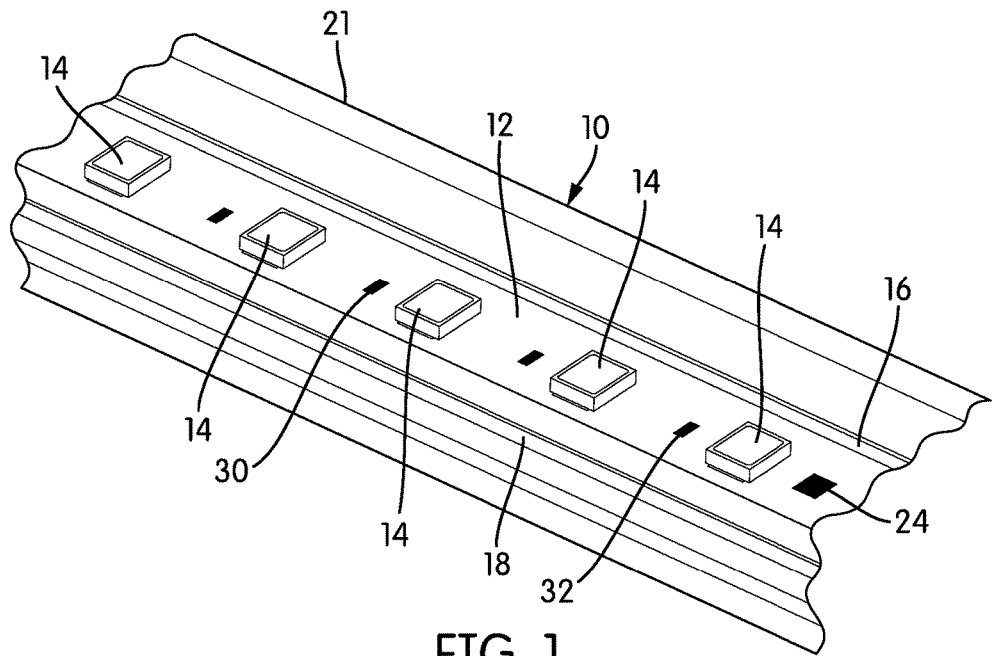
FIG. 1 is a perspective view of linear lighting according to one embodiment of the invention.

FIG. 1 is a perspective view of a strip of linear LED lighting, generally indicated at 10. The linear lighting 10 comprises a printed circuit board (PCB) 12 on which a number of LED light engines 14 are disposed, spaced at a regular pitch. (As the term is used here, "LED light engine" refers to one or more light-emitting diodes, packaged with a phosphor, that act as a light source.)

The linear lighting 10 operates at high voltage. On the sides of the PCB 12, power and ground leads 16, 18 extend the full length of the linear lighting 10. The power and ground leads 16, 18 typically carry the voltage at which the linear lighting 10 is designed to operate, which may be, for example, 110-120V, 220-240V, or 277V of alternating current (AC). The entire assembly is enclosed within a flexible casing or covering 21, typically made of a clear plastic, such as polyvinyl chloride (PVC). The casing or covering 21 may include plasticizers and other conventional additives to modify its mechanical properties.

Typically, the PCB 12 would be flexible, made, for example, of a material such as Mylar. Of course, that is not the only material from which the PCB 12 may be made—in sufficiently thin section, many materials possess the kind of flexibility that is useful in the linear lighting 10, including thin sections of FR4 (i.e., glass fiber composite), aluminum, polyimide, silicon, gold, carbon nanotubes, and any number of plastics. In the linear lighting 10, the LED light engines 14 are mounted on a first layer, and there is at least one other layer that carries power and signals, although any number of layers may be included in the PCB 12, and those layers may be designed in any manner.

Depending on the application, the LED light engines 14 may be bare LEDs, but in most embodiments, each LED light engine 14 comprises one or more individual LEDs, packaged together with an element or elements that modify or diffuse the light produced by the LEDs. Most LED light engines 14 will include a phosphor to modify the color or color temperature of the light, and some may include diffusing or lensing elements as well. For purposes of this description, it will be assumed that the LED light engines 14 are configured to accept low voltage DC. The LED light engines 14 may be single color, red-green-blue (RGB) selectable color, or contain any other type of LEDs.

Figure 2:
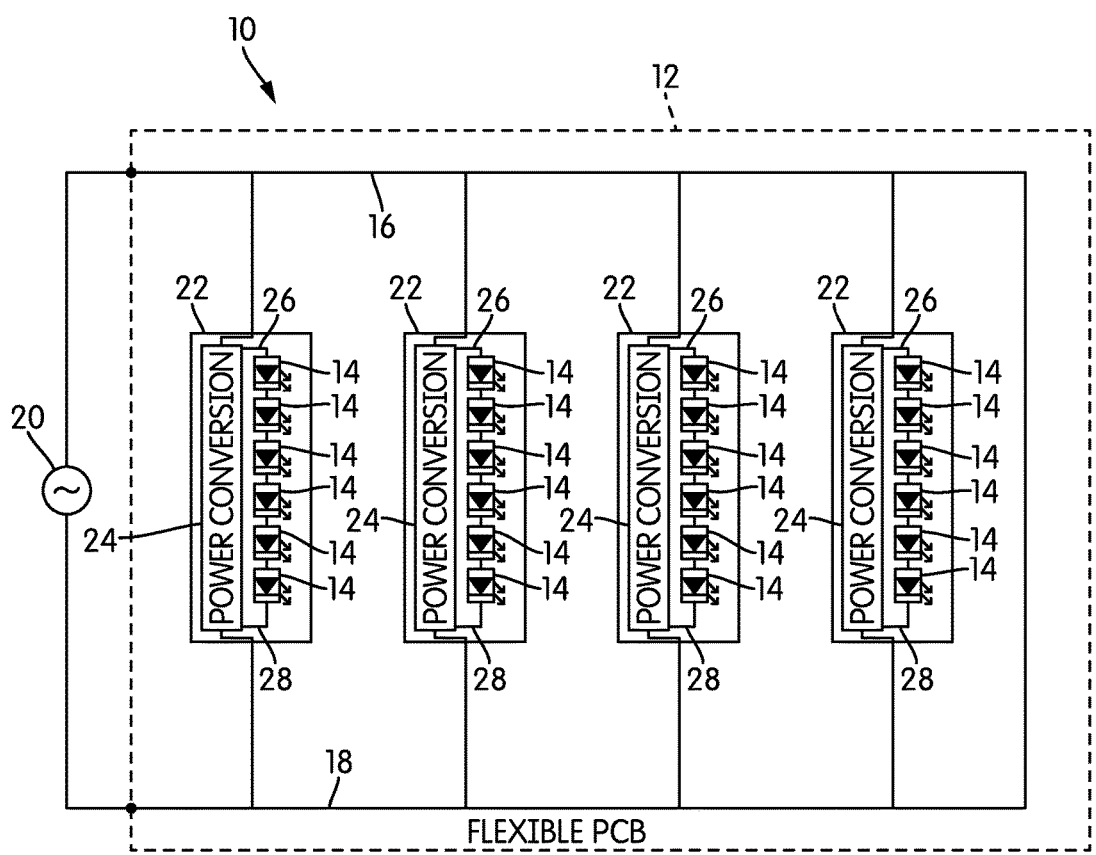
FIG. 2 is a schematic diagram of the linear lighting of FIG. 1.

FIG. 2 is a schematic diagram of the linear lighting 10 of FIG. 1, illustrating the manner in which the LED light engines 14 are connected to power. An AC power source 20 is indicated in FIG. 2. The AC power source 20 would typically be a household or commercial power source. In some embodiments, the power may be filtered to eliminate spikes, or delivered to the linear lighting 10 through a fuse or other components designed to mitigate the risk of electrical faults. However, as will be explained in greater detail below, the linear lighting 10 is designed to accept high voltage AC directly and convert it to DC as needed, with the power conversion function distributed across the entire active PCB 12. In many cases, this eliminates the need for a large, external driver.

While the linear lighting 10 is physically a continuous strip of LED light engines 14 arranged at a regular pitch on the PCB 12, electrically, the situation is somewhat more complex. The PCB 12 is divided into a number of repeating blocks 22. Each repeating block 22 has the same structure: a set of power conversion and conditioning circuits 24, to which a number of LED light engines 14 are connected. The power conversion and conditioning circuits 24 are electrically connected to the power and ground leads 16, 18 that traverse the length of the PCB 12; therefore, they draw high-voltage AC power from the AC power source 20 and convert that power from AC to DC. Connected to the outputs 26, 28 of the power conversion circuits 24 are a number of LED light engines 14.

As can be seen in FIG. 2, the repeating blocks 22 are electrically connected in parallel with respect to one another. The LED light engines 14 within each repeating block 22 (which draw low-voltage DC power from the power conversion circuits 24) are electrically connected in series with one another. This arrangement has several implications and advantages. For one, as was noted briefly above, the power conversion function is distributed over the entire PCB 12, with power conversion and conditioning circuits 24 in each repeating block 22. This means that the power conversion and conditioning circuits 24 can be designed to handle less power individually, as each of the power conversion circuits 24 need only convert and supply the amount of power needed for its repeating block 22, as opposed to converting and supplying all the power needed by the entire strip of linear lighting 12 at one point. The fact that the power conversion is distributed among the repeating blocks 22 also means that the power conversion and conditioning circuits 24 can be physically smaller, such that, in many cases, the power conversion circuits 24 can be on the PCB 12 without affecting the pitch or spacing of the LED light engines 14.

A second advantage lies in the arrangement of FIG. 2—an electrical fault, particularly within the connections between the LED light engines 14, is more likely to be isolated within a single repeating block 22. In other words, unless the main power and ground leads 16, 18 are broken or shorted, it is much less likely that a fault with a single LED light engine 14, or a connection between individual LED light engines 14, will cause the entire strip of linear lighting 10 to go dark. In this situation, it is more likely that only the LED light engines 14 within a single repeating block 22 will be affected.

The number of LED light engines 14 within each repeating block 22 may vary from embodiment to embodiment. The amount of power drawn by each LED light engine 14, the maximum power handling capabilities of the power conversion and conditioning circuits 24, and the maximum number of LED light engines 14 that are allowed to go dark in the case of a fault are all factors in the number of LED light engines 14 included in any repeating block 22. Typically, 6-8 LED light engines 14 would be included in any one repeating block 22, although, for example, up to 50 LED light engines 14 may be included in one repeating block 22 in some cases. Additionally, although it is advantageous if each repeating block 22 has the same number LED light engines 14, in some cases, individual repeating blocks 22 may have different numbers of LED light engines 14. Variations on this are possible—for example, an A-type repeating block may have one number of LED light engines 14, while a B-type repeating block may have a second number of LED light engines 14, and those two blocks may be arranged in a regular pattern, such as A-B-A-B, along the length of the PCB 12. While it is also generally assumed for purposes of this description that the LED light engines 14 within each repeating block 22 will be identical, that need not be the case either—an A-type repeating block may have one type of LED light engines and a B-type repeating block may have another type of LED light engines.

The division of the linear lighting 10 into repeating blocks 22 has another practical advantage as well: the PCB 12 can be cut and terminated between repeating blocks 22, which means that the linear lighting 10 can be manufactured in long lengths and cut to shorter lengths. While regulatory requirements may control or influence by whom and under what circumstances the PCB 12 can be cut and terminated, such that the linear lighting 10 is not "field cuttable" in the usual sense (i.e., by an electrician or contractor at the time of installation), the manufacturer or an approved customizer can easily customize it for essentially any needed length by cutting between repeating blocks 22. The length of any one repeating unit may be, e.g., 10-12 cm with about a 1.5 cm pitch or spacing of the LED light engines 14, although the pitch and length of any particular repeating unit may be selected depending on the application and other factors. Jacketed in the casing or covering 21, the linear lighting 10 may have an overall width, for example, in the range of about 1.6 cm, with a covering 21 thickness in the range of about 2 mm. In a typical embodiment, a single length of the linear lighting may extend, e.g., about 50 m (about 150 feet) at 120V, or considerably longer if some diminishment in the light levels of the LED light engines 14 can be tolerated.

As those of skill in the art will realize, FIG. 2 focuses on power connections; the linear lighting 10 may also include data and control circuits and communication lines to control, for example, the color of the LED light engines 14, the light intensity of the LED light engines 14, and other such features. Each repeating block 22 may include such data and control circuits. For example, 0-10V DC light intensity control may be implemented in the repeating blocks 22.

Figure 3:
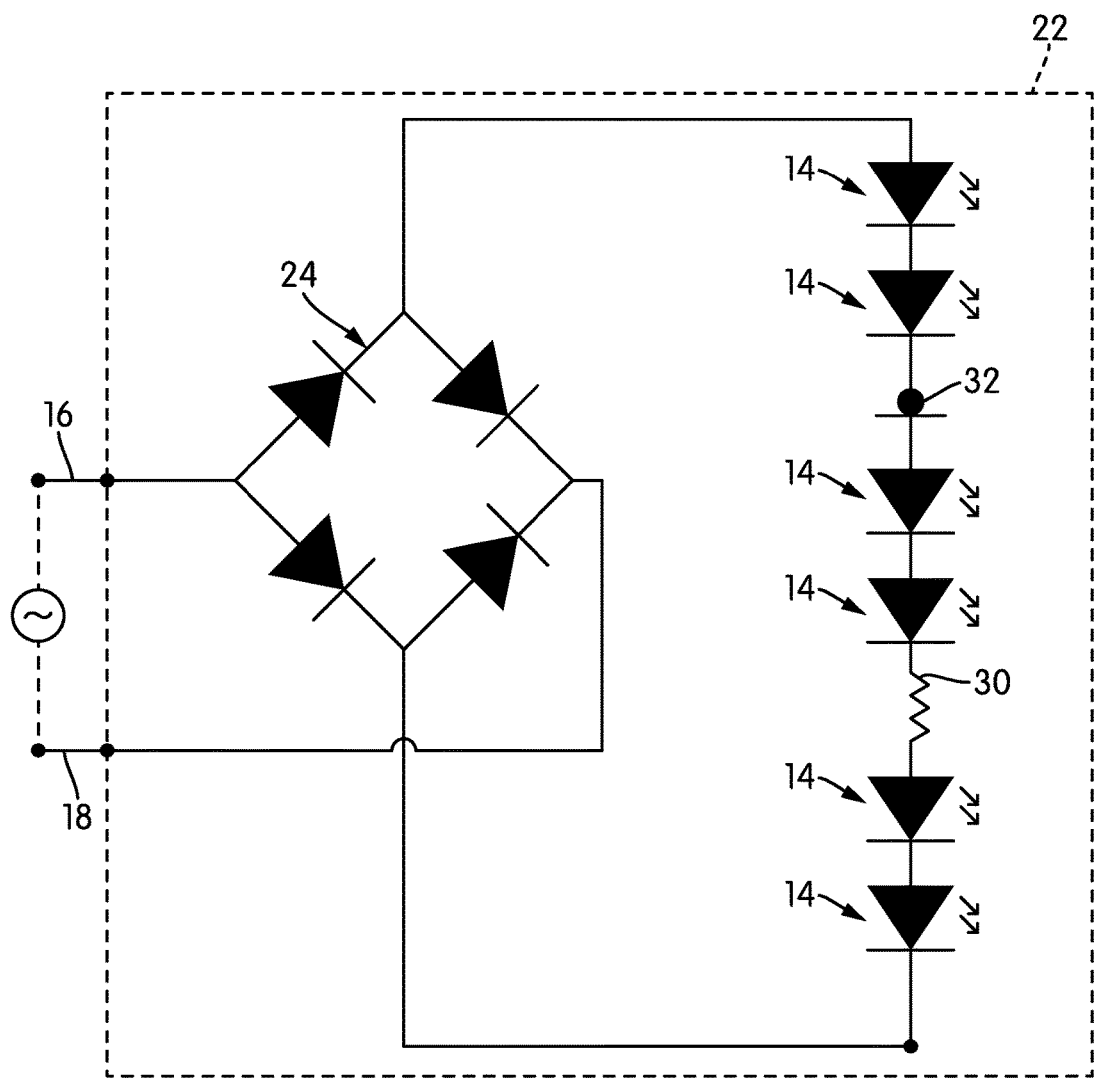
FIG. 3 is a circuit diagram of a repeating block according to one embodiment of the invention.

FIG. 3 is a circuit diagram of one embodiment of a repeating block 22. In this repeating block 22, the power conversion circuits 24 comprise a full-wave rectifier 24 (also called a "full-bridge" rectifier), which takes AC power from the power and ground leads 16, 18 that traverse the length of the PCB 12. The outputs of the full-wave rectifier 24 connect to a number of LED light engines 14, which are arranged in series with respect to one another. (In FIG. 3, the symbol for a single LED is used for clarity and simplicity, although it is understood that these LEDs would typically be in the form of packaged light engines 14, as described above.) A number of other components may also be included in the repeating block 22, typically in series or parallel with the LED light engines 14. For example, the repeating block 22 of FIG. 3 includes two components arranged in series with the LED light engines 14: a current control or ballast resistor 30, and a separate current controller 32, which is an integrated circuit that provides a constant output current. The resistor 30 and current controller 32 provide current at a constant level for the LEDs.

As those of skill in the art will appreciate, the repeating block 22 of FIG. 3 thus offers a relatively simple AC-to-DC power conversion, inverting the negative portion of the AC sinusoid and thus providing DC power at a frequency of twice that of the original AC power. The advantage of a relatively simple power conversion circuit in each repeating block 22 is that the components are generally small and robust, which means that they can be placed interstitially between the LED light engines 14 without changing or lengthening their pitch. This can be seen in the perspective view of FIG. 1, in which the rectifier 24 has the form of a small, packaged integrated circuit, and the other components, like the ballast resistor 30 and the current controller 32, are also placed interstitially between the LED light engines 14.

As those of skill in the art will also appreciate, LEDs typically operate best as constant current devices. The input voltage to any particular repeating block 22 will depend on its location along the PCB 12 relative to the power source and the voltage drop per unit length (or per repeating block 22) of the linear lighting 10. However, by use of resistors, current controllers, and other such elements, each repeating block 22 provides the LED light engines 14 with constant current.

Figure 4:
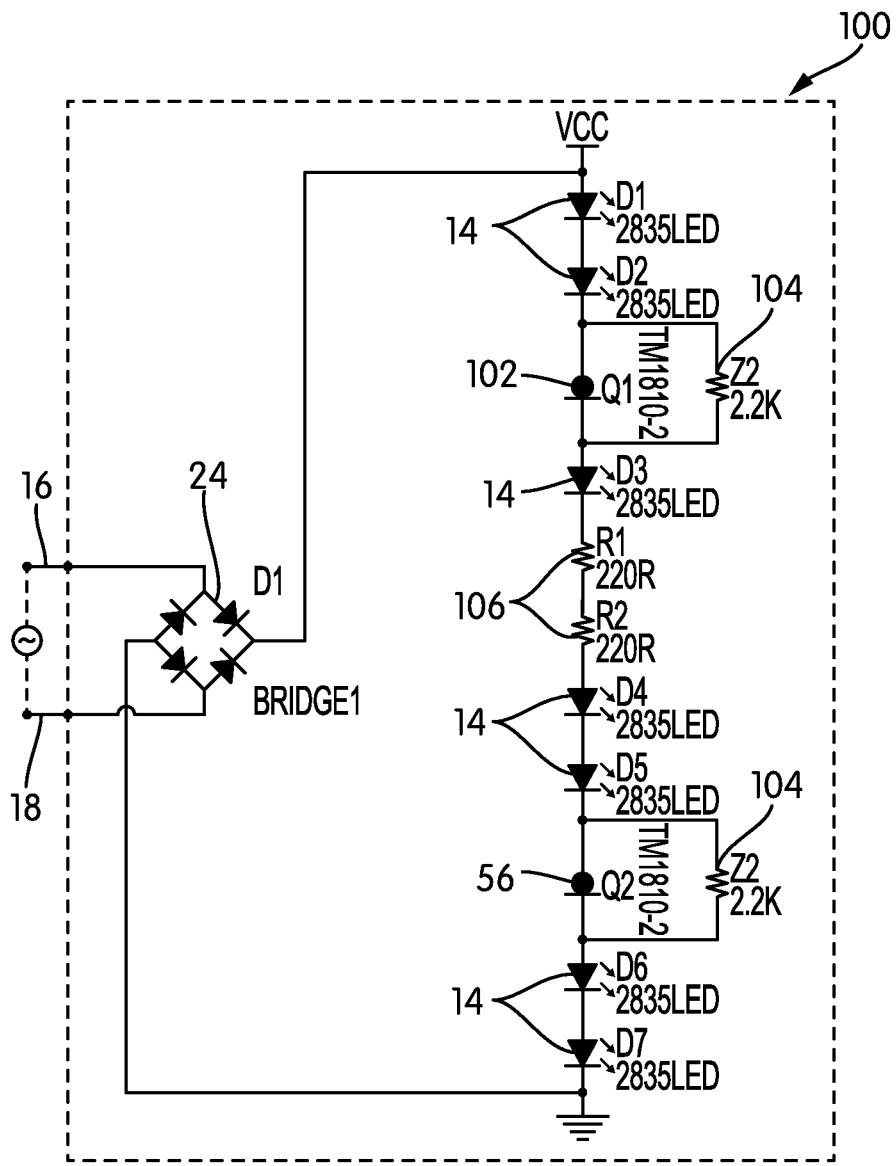
FIG. 4 is a circuit diagram of a repeating block according to another embodiment of the invention.

A somewhat more complex embodiment of a repeating block 100 is shown in FIG. 4. This repeating block 100 has the same full-bridge rectifier 24 as the previous embodiment. In the repeating block 100, there are seven LED light engines 14. A current controller 102 is positioned in series with the LED light engines 14. In this embodiment, the current controller 102 is a TM1810-2 single-channel LED constant current driver IC (Titan Micro Electronics, Shenzhen, China). Since each current controller 102 can handle at most about 24V input, a 2.2 kΩ resistor 104 is arranged in parallel with each current controller 102 to act as a voltage divider and reduce the input voltage to the current controller 102. There are also two general "ballast" resistors 106 arranged in series with the LED light engines 14, in this embodiment, each 220Ω. In essence, this embodiment of a repeating block 100 is adapted for the capabilities of the current controller 102.

The repeating blocks 22, 100 of FIGS. 3 and 4 use the output of the rectifier 24 as-is. That need not be the case in all embodiments. As was described briefly above, the output of a simple rectifier 24 is not a "smooth" waveform; rather, it ranges cyclically between 0V and a maximum that depends on the original AC voltage. This can create complications. When the voltage goes below a minimum saturation voltage needed to power the LED light engines 14—even briefly—the LED light engines 14 will switch off, as they respond very quickly to changes in voltage. If the frequency of the power signal is low enough, a flicker may be perceptible to the human eye. Flickering light is generally seen as undesirable, especially in applications where constant light output is expected or required. There are two potential solutions to this problem: offset the voltage of the power signal so that it never goes below the saturation voltage needed to power the LED light engines 14, or increase the frequency of the power signal beyond the human eye's ability to perceive any flicker, essentially allowing human persistence of vision to give the impression of constant light. Embodiments of the invention may use either approach or both approaches.

With respect to the frequency of the power signal, the full-wave rectifier 24 is, in essence a frequency doubler. As was noted briefly above, by inverting the negative portion of the AC sinusoid, it doubles the frequency. Thus, for example, a 60 Hz AC power signal becomes 120 Hz when rectified. This may be sufficient to eliminate visible flicker in at least some embodiments.

Figure 5:
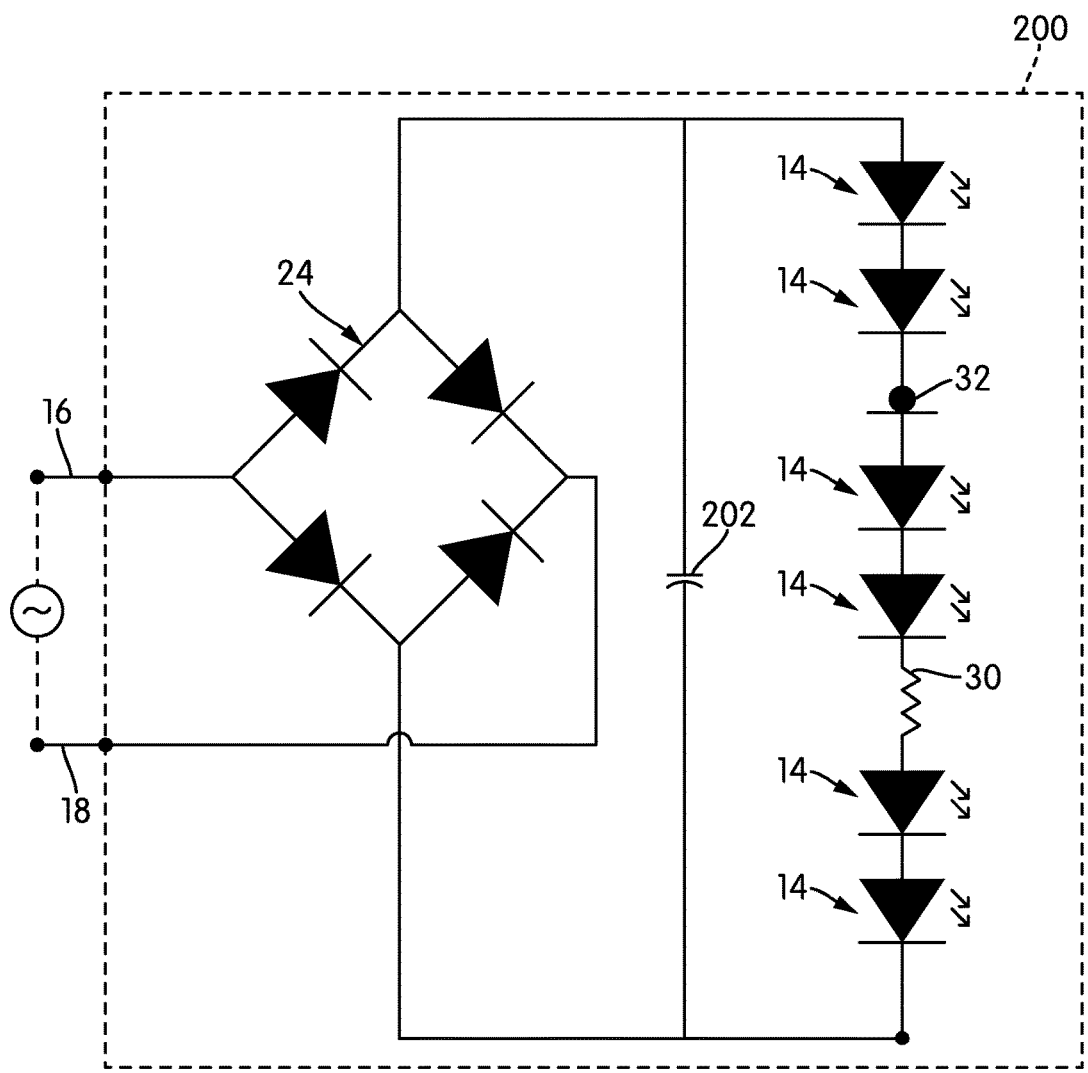
FIG. 5 is a circuit diagram of a repeating block implementing a power filter for reducing light flicker according to yet another embodiment of the invention.

As one example of how the power signal can also be modified to offset or increase the minimum voltage of the power signal, FIG. 5 illustrates a repeating block 200 according to yet another embodiment of the invention. In this embodiment, the components of the repeating block 200 are essentially the same as those in the repeating block 100 of FIG. 3. However, in addition to those components, the repeating block 200 includes a capacitor 202 in parallel to the LED light engines 14 and other components. When the rectifier 24 is delivering power, the capacitor 202 stores charge. When the voltage output of the rectifier 24 drops momentarily to zero as one cycle concludes and another begins, the capacitor 202 discharges, supplying a voltage to the circuit and keeping the total voltage seen by the LED light engines 14 above zero. With the repeating block 200, the power signal seen by the LED light engines 14 will have a sawtooth quality to it; in some cases, an additional resistor in series with the capacitor 202 (not shown in FIG. 5) can be used to control the rate at which the capacitor 202 discharges, and thus, smooth the power signal.

As those of skill in the art will appreciate, a capacitor that is large enough to handle high voltage may be physically rather large. If a single capacitor is too large to be placed in a repeating block 100, 200, smaller capacitors or resistor-capacitor (RC) filters may be placed in parallel with each of the individual LED light engines 14.

Although the advantages of an onboard rectifier were described above with respect to a high-voltage strip light 10, these principles are equally applicable to a low-voltage strip light, e.g., operating at 12-24V. For example, outdoor landscape lighting sometimes operates at 12VAC, and a strip light with an onboard rectifier and other power conditioning circuitry might be ideal in this application.

Figure 6:
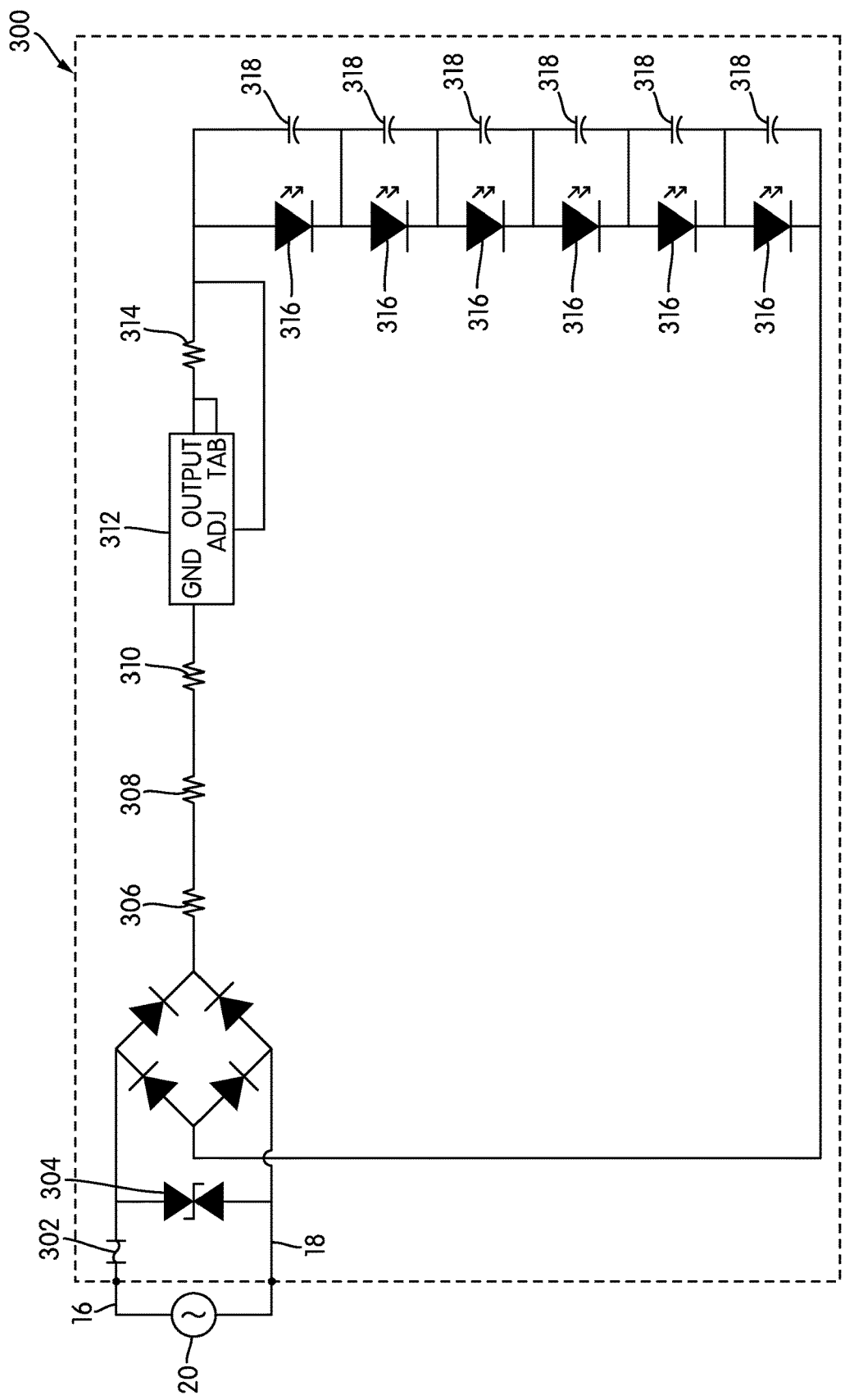
FIG. 6 is a circuit diagram of a repeating block with another type of power filter.

FIG. 6 is a circuit diagram of a repeating block, generally indicated at 300, that incorporates power filtering features. The repeating block 300, in contrast to the repeating blocks 100, 200 described above, has protective circuitry, including a fuse 302 between the power lead 16 and the rectifier 24, and a transient voltage suppression (TVS) diode 304 electrically in parallel with the rectifier 24. The fuse 302 and the TVS diode 304 serve to protect against voltage surges. Other protective elements may be included as well.

As with the repeating blocks 10, 100, 200 described above, the repeating block 300 has at least one resistor, although in many cases, several smaller resistors may be used, either in series or in parallel, in lieu of one large resistor. In the embodiment of FIG. 6, there are three resistors 306, 308, 310 in series. The actual characteristics of the resistors 306, 308, 310 will vary based on the number of LED light engines that are in the repeating block and other factors. That said, it is helpful if the resistors 306, 308, 310 have power ratings such that if one LED light engine in the block fails, the resistors 306, 308, 310 can dissipate the excess power without causing the rest of the LED light engines in the block to fail. The presence of three resistors 306, 308, 310 also allows one to use resistors with a lower power rating, as compared with a single, large resistor.

Assuming, for example, that the power source 20 is a 120V RMS power source, the resistors 306, 308, 310 of the illustrated embodiment may be, for example, ½ watt resistors in surface-mount packages, such as 0805 surface mount packages. The resistance of each resistor will also vary depending on the other characteristics of the repeating block 300, the number of LED light engines, the input AC voltage, and other such factors. However, a resistance in the range of 200-300Ω per resistor 306, 308, 310 (700-1000Ω total ballast resistance) is typical. For example, in the embodiment of FIG. 6, each resistor 306, 308, 310 may have a resistance of about 270Ω. Resistor tolerances may be, e.g., 5%.

A current controller or regulator 312 is also provided in the repeating block 300, and serves as a constant-current source. The current regulator 312 may be, for example, a Texas Instruments LM317L 3-terminal regulator. The current regulator 312 has its own external resistor 314 that is used to set the output current.

As with the other repeating blocks 10, 100, 200, the repeating block 300 has a number of LED light engines 316 in series with one another. In the illustrated embodiment, there are six LED light engines 316, although as was described above, there may be any number of LED light engines 316 in a repeating block 300, although if there are more or fewer, the ballast resistance and other characteristics of the repeating block 300 may need to be altered accordingly. In the embodiment of FIG. 6, the LED light engines 316 may be, for example, ACRICH MJT 3030 light engines (Seoul Semiconductor Co. Ltd., Republic of Korea), with operating voltages of 21-25V each.

In the repeating block 300, each LED light engine 316 has a capacitor 318 arranged separately in parallel with it. As was described briefly above, placing capacitors 318 separately in parallel with each light engine 316 accomplishes essentially the same function as placing a capacitor 202 in parallel with the rectifier 24, as in repeating block 200. However, by using several capacitors 318, the voltage rating, capacitance, and physical size of each capacitor 318 may be much smaller than if a single capacitor 202 is used. In embodiments of the invention like that of FIG. 6, for example, the individual capacitors 318 may be rated for 35V and have capacitances of 10 µF, although the working voltage seen by each capacitor 318 may be more in the range of about 20V.

Additionally, the particular arrangement shown in FIG. 6 allows for some redundancy. If a single capacitor 318 fails, the other capacitors 318 may still be able to provide adequate filtering. Additionally, the arrangement of FIG. 6 physically distributes the filtering components along the circuit, which is beneficial from a design standpoint.

While any type of capacitor 318 may be used in the repeating block 300, the type of capacitor will affect factors like the height of the linear lighting 10, its reliability, and its service lifetime. For these applications, solid tantalum capacitors may be particularly advantageous because, among other things, they hold their capacitance at higher temperatures, can handle higher voltages than other types of capacitors, and have a longer service lifetime than, e.g., standard electrolytic capacitors. While tantalum capacitors can be voltage sensitive, the LED light engines 316 have a voltage-regulating effect and thus, may protect the capacitors 318. While any form of device package may be used, as with the other components, surface mount packages are particularly suitable.

The number of LED light engines 316 in a repeating block 300 may vary from embodiment to embodiment, and if the number of LED light engines 316 is changed, the total ballast resistance, the capacitance, and other such values may be altered accordingly.

Figure 7:
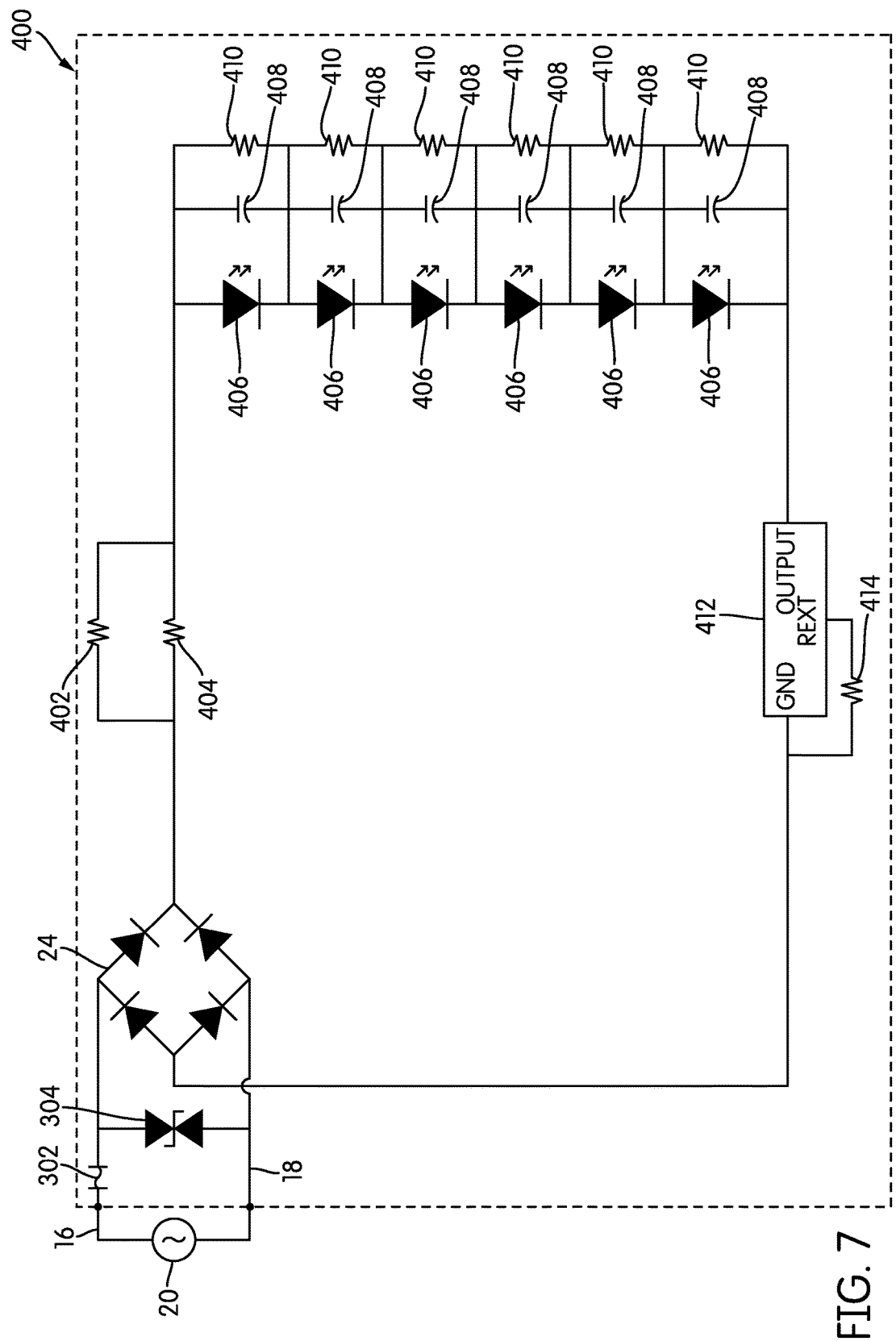
FIG. 7 is a circuit diagram of a repeating block with yet another type of power filter that includes an additional resistive load.

FIG. 7 is a circuit diagram of a repeating block, generally indicated at 400, according to another embodiment of the invention. Repeating block 400 has a number of features similar to, or the same as, those of repeating block 300, including a fuse 302 and transient voltage suppression diode 304 between the AC power source 20 and the rectifier 24. Repeating block 400 also has ballast resistors 402, 404, in this case, arranged in parallel with one another. The ballast resistors 402, 404 may, for example, be 810Ω, 0.5 W resistors in 0805 surface mount packages, although the ballast resistors 402, 404 need not necessarily be identical in all embodiments.

In repeating block 400, there are again six LED light engines 406, which may be the same as the light engines 316 or different, with capacitors 408 arranged in parallel with each one. The capacitors 318, 408 in the repeating blocks 300, 400 store charge when a voltage is applied, and discharge when a voltage is no longer applied. That very property helps to smooth the power waveform, because the capacitors 318, 408 store charge cyclically when the AC voltage rises and discharge cyclically as the AC voltage drops to zero, compensating for the drop in the AC voltage and making the overall output voltage more constant. Yet although the capacitors 318, 408 are advantageous when the circuit is in operation, when the power is shut off, the capacitors 318, 408 and their stored power may be something of a disadvantage.

The presence of the capacitors 318, 408 may make it more difficult for the repeating block 300, 400 to respond immediately to a shutdown. Simply put, the power in the capacitors 318, 408 must go somewhere when the AC power source 20 is shut down. In repeating block 300, the capacitors 316 may discharge into the LED light engines 316, causing them to glow for some period of time after the circuit is shut down—an effect that is usually undesirable. In some cases, the capacitors 316 may have difficulty discharging at all, because the LED light engines 316, 406 are relatively high impedance components when the circuit is off.

Thus, repeating block 400 also includes a resistor 410 in parallel with each capacitor 408. When repeating block 400 powers down, the power stored in the capacitors 408 discharges into, and is dissipated by, the resistors 408. The resistors 410 may also improve the dimming performance of the repeating block 400 by helping to dissipate power quickly in the non-steady state conditions that dimmers often create. The resistors 410 may be, for example, 4.7 kΩ, 0.5 W resistors, again in surface mount packages.

Repeating block 400 also uses a different constant current driver 412, in this case, an SM2082D constant current driver (Shenzhen Zhengmingke Electronics Co., Ltd., Shenzhen, China), with an external resistor 414 to set the output current to about 40 mA.

The presence of the capacitors 318, 408 in the repeating blocks 300, 400 may have the beneficial effect of reducing flicker. Flicker, as described briefly above, is a variance in luminance over time. As reflected in IEEE Standard 1789, which was incorporated by reference above, flicker is measured in a number of standard ways. For example, given a graph of an LED lighting fixture's light output over time, the flicker index is defined as the area of the curve above the line of average light divided by the total area of the light output curve. The percent flicker or modulation percent is defined as the difference between the maximum and minimum illumination divided by the sum of the maximum and the minimum. Generally speaking, the capacitance of each capacitor 318, 408 may be chosen to meet specific targets for flicker index, percent flicker, or any other common metric of flicker.

EXAMPLE

In order to find the most appropriate capacitance values for capacitors in a repeating block, a single repeating block 100 of FIG. 4 was tested by manually placing tantalum capacitors across each of its LED light engines 14, such that each LED light engine 14 was electrically in parallel with a different capacitor. The modified repeating block 100 was connected to standard North American AC power (110V) through a Lutron DIVA DVELV-300P dimmer (Lutron Electronics Co., Inc., Coopersburg, Pa., United States). A separate 1 m section of linear lighting 10 including repeating blocks 100 was connected in parallel with the block under test in order to load the dimmer appropriately. Flicker index and percent flicker were measured individually for each LED in the modified repeating block 100 using a Metrue LFM-300 flicker meter.

Figure 8:
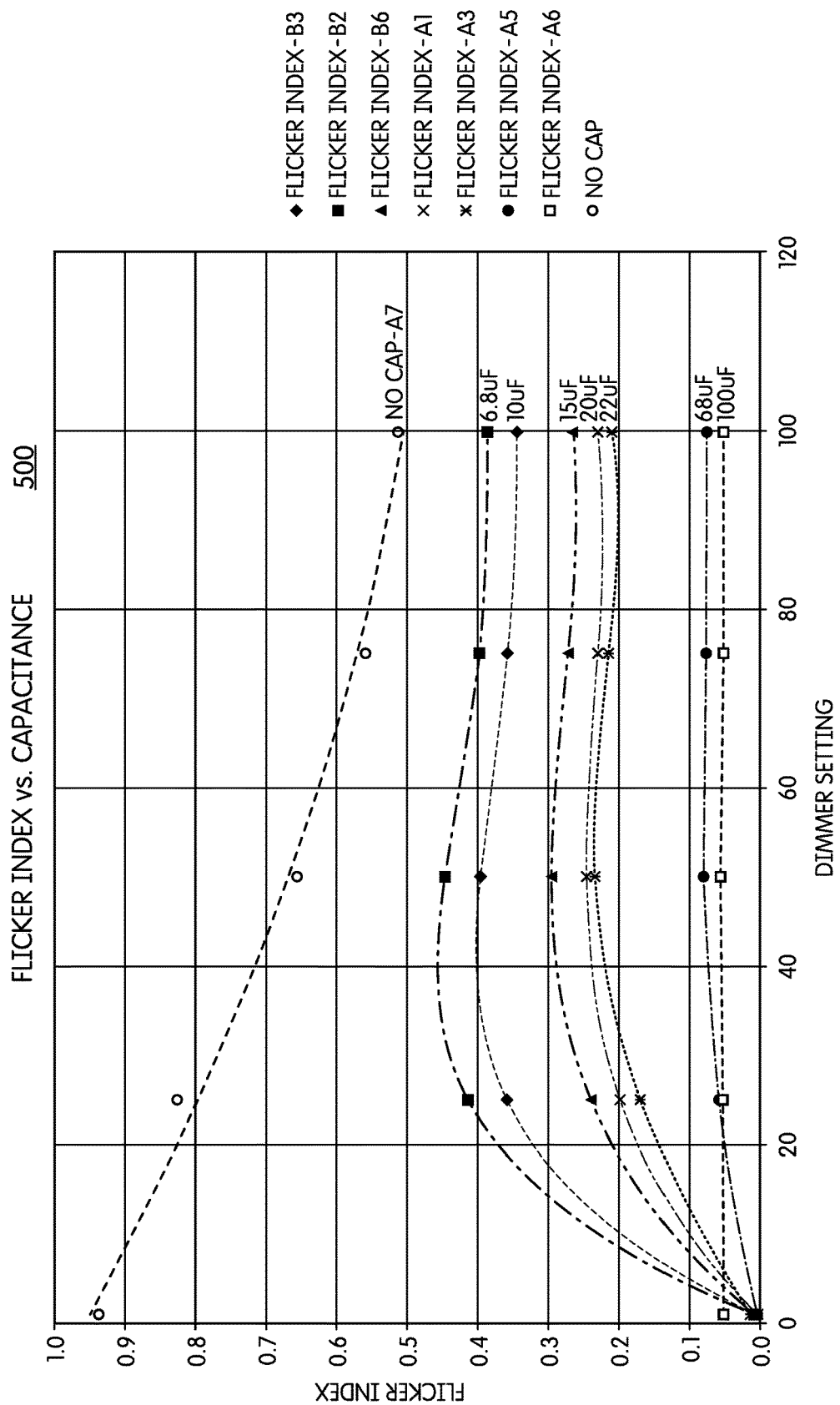
FIGS. 8 and 9 are graphs of flicker index and percent flicker for linear lighting for the repeating block of FIG. 4 with capacitors of various capacitances laid in parallel with each one of the LED light engines in the repeating block.
Figure 9:
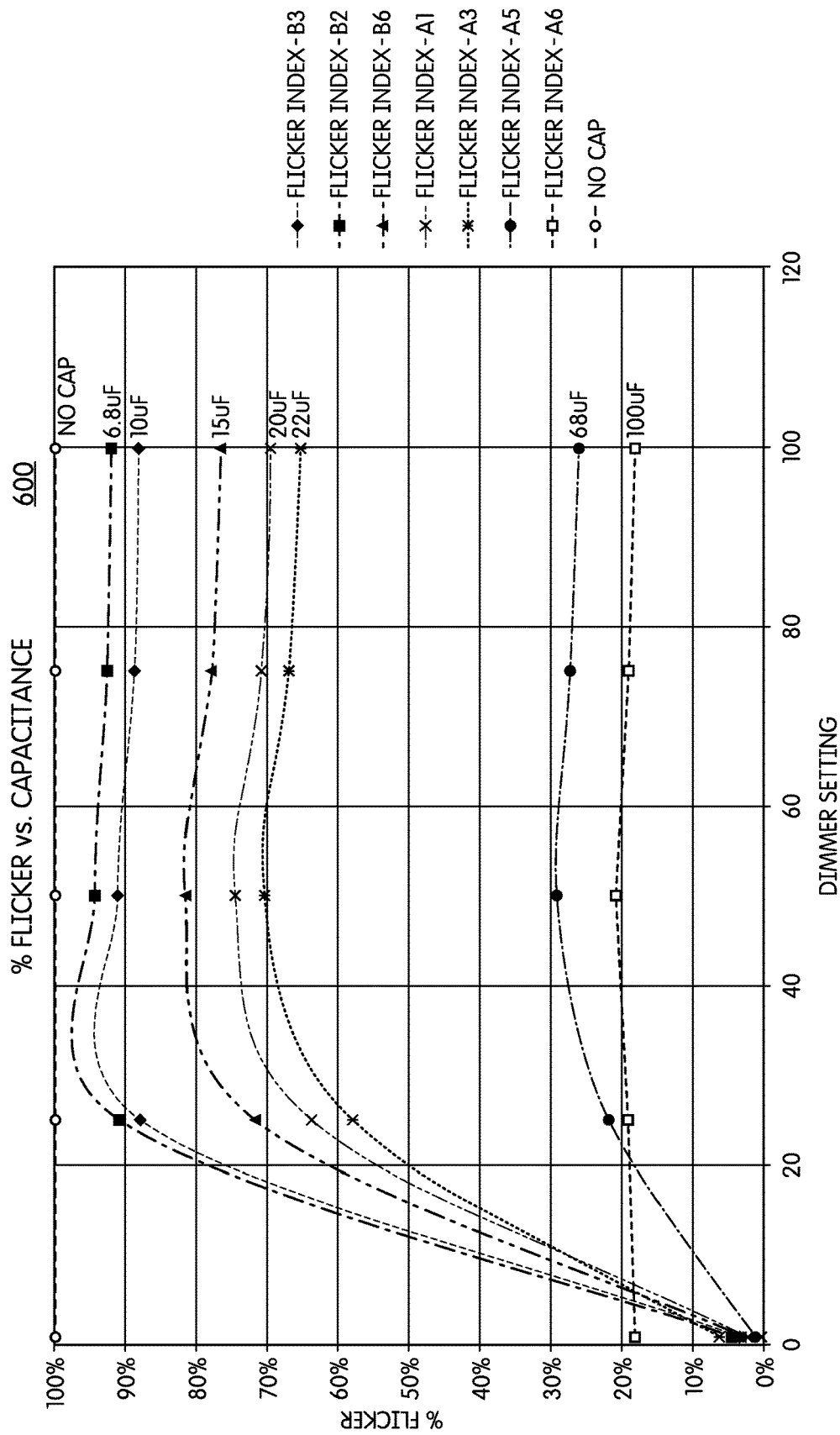

Capacitors with 6.8 µF, 10 µF, 15 µF, 20 µF, 24 µF, 68 µF, and 100 µF capacitances were tested, and were compared with flicker metrics for an LED light engine 14 with no capacitor. The results are shown in graph 500 of FIG. 8 and graph 600 of FIG. 9. In general, with no capacitor, an LED light engine 14 in repeating block 100 had a 100% flicker at all dimmer settings, with a flicker index of just over 0.5 at 100% dimmer setting and about 0.94 at the lowest dimmer setting. By contrast, LED light engines 14 with the 20 µF and 22 µF capacitors had flicker indices around 0.2 for most dimmer settings in the range of 20%-100%, and about 60-70% flicker in that dimming range. LED light engines with the 68 µF and 100 µF capacitors had substantially lower flicker indices and percent flicker.

Ultimately, the precise capacitance that is used in any repeating block will depend on the flicker index, percent flicker, and other metrics that are achieved, as well as the cost and size of the capacitors in question. Typically, one will seek a balance between the results achieved and the cost and size of the capacitor.

The repeating blocks 300, 400 of FIGS. 3 and 4 use passive devices—capacitors and resistors—to smooth the rectified power and reduce flicker. In some instances, however, it may be useful to use active devices to perform some of these functions.

Figure 10:
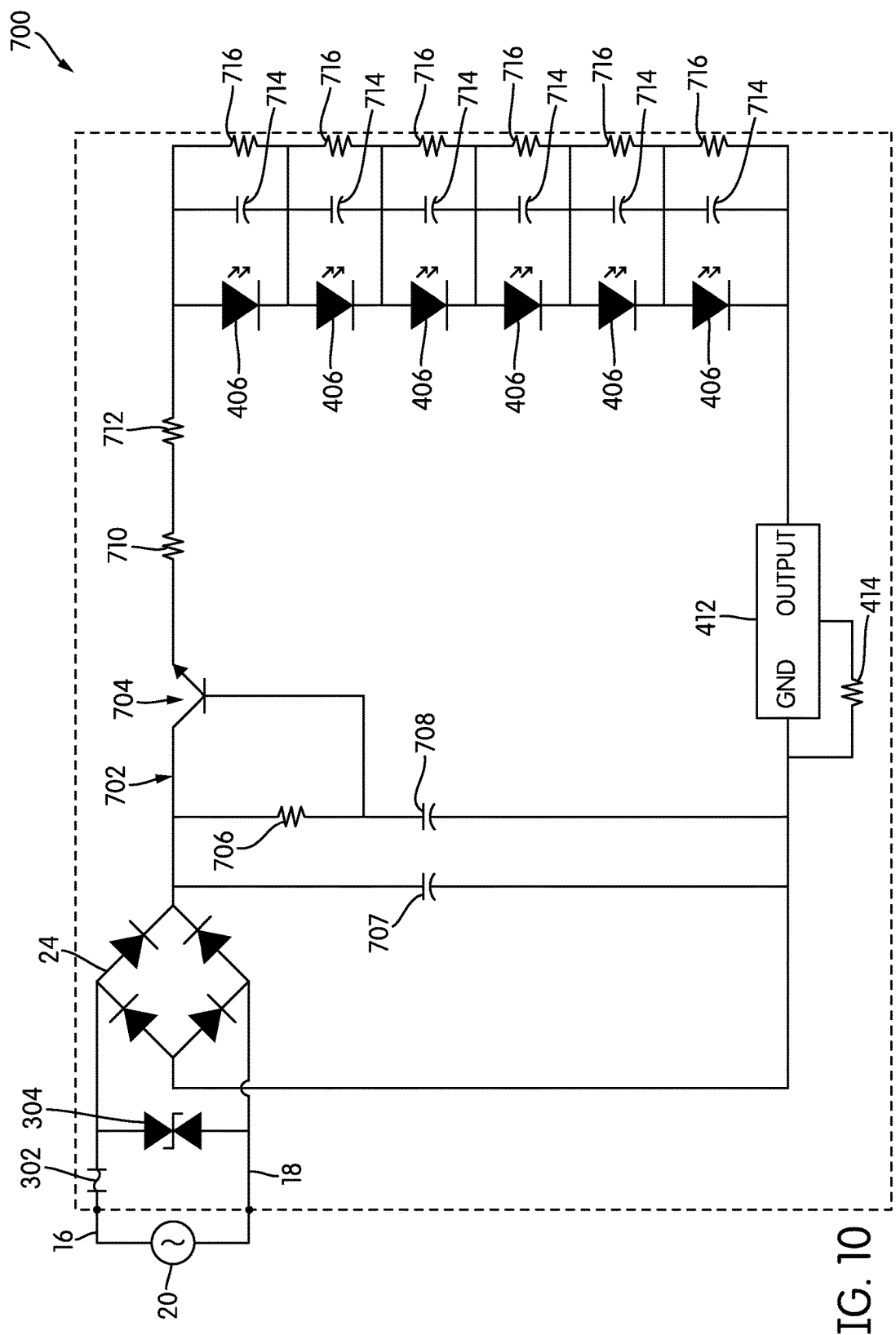
FIG. 10 is a circuit diagram of a repeating block with a power filter including a capacitance multiplier.

FIG. 10 is a circuit diagram of a repeating block, generally indicated at 700, that includes an active capacitance multiplier 702. More specifically, rectified power is output by the rectifier 24 and runs through the capacitance multiplier 702. The capacitance multiplier 702 is a simple emitter follower comprising a transistor 704, a resistor 706, and a capacitor 708. The resistor 706, connected between the voltage input of the transistor 704 and the base of the transistor 704, provides bias for the base-emitter junction, and the capacitor 708 provides a smoothing, flicker-reducing function. The capacitance multiplier effectively multiplies the capacitance of the capacitor 708 by the gain of the transistor 704. Ultimately, this would provide a large capacitance in the circuit to filter the incoming power with a smaller physical footprint than that of a large capacitor alone.

As shown in FIG. 10, an additional capacitor 707 may be installed between the rectifier and the capacitance multiplier 702. The additional capacitor 707 is an optional component, and serves to filter the power output from the rectifier 24 so that the transistor 704 of the capacitance multiplier 702 is exposed only to the ripple voltage. This allows a smaller, lower voltage transistor 704 to be used. If an additional capacitor 707 is not provided, a larger, more expensive high-voltage transistor would be needed. For a 110-120V AC power input, that high-voltage transistor would likely need a collector-emitter breakdown voltage of 200V.

Beyond the capacitance multiplier 702, repeating block 700 bears a strong resemblance to repeating block 400: two ballast resistors 710, 712; six LED light engines 406 in series with one another, and a capacitor 714 and resistor 716 in parallel with each one of the LED light engines 406. A constant current driver 412 and its external resistor 414 are also provided. One advantageous difference between repeating blocks 400 and 700 is that the capacitors 714 and resistors 716 in repeating block 700 will typically be smaller, because much of their smoothing function is performed by the capacitance multiplier 702. In essence, the capacitance multiplier 702 serves as a first-stage filter, and the individual capacitors 714 and resistors 716 in parallel with each LED light engine 406 serve as a second-stage filter.

Of course, a capacitor multiplier 702 may be incorporated into any repeating block, and if the capacitor multiplier 702 is effective in smoothing the power and preventing flicker by itself, capacitors and resistors in parallel with each LED light engine may be unnecessary. Additionally, while repeating block 700 of FIG. 10 shows a capacitor multiplier 702 using a transistor 704, similar circuits using an op amp are well known in the art and may be used in embodiments of the invention.

Although the above description refers to individual capacitors 202, 318, 408, 508, 714 and individual resistors 410, 706, 716 in the various repeating blocks, as those of skill in the art will understand, that need not be the case in all embodiments. In any place where one capacitor or one resistor is shown, that single component could be replaced with multiple components, i.e., multiple resistors or multiple capacitors. Thus, in this description and in the following claims, the term "capacitive load" refers to one or more capacitors used collectively as one, and the term "resistive load" refers to one or more resistors used together as one. It should also be understood that a single capacitor may be placed in parallel with several LED light engines, as may a single resistor.

While the invention has been described with respect to certain embodiments, the embodiments are intended to be exemplary, rather than limiting. Modifications and changes may be made within the scope of the invention, which is defined by the appended claims.

What is claimed is:

1. A flexible strip of linear lighting, comprising:
    a narrow, elongate, flexible printed circuit board (PCB) physically and electrically arranged in a plurality of repeating blocks, each of the one or more repeating blocks being arranged electrically in parallel with one another between power and ground, and each of the plurality of repeating blocks including
        electrical connections to receive high-voltage alternating current (AC) power,
        a power conversion and conditioning circuit including at least a full-bridge rectifier mounted on the PCB and connected to the electrical connections that converts the high-voltage AC power to direct current (DC) power,
        a plurality of LED light engines electrically connected to the power conversion and conditioning circuit to receive the DC power, and
        a filter connected to the plurality of LED light engines, the filter being adapted such that each of the plurality of LED light engines has a flicker percentage of 70% or lower when each of the plurality of repeating blocks is connected to the high-voltage AC power through an electronic low voltage dimmer at a dimmer setting of 100%;
    a pair of conductors traversing the length of the flexible PCB to provide the power and the ground for each of the plurality of repeating blocks, the pair of conductors adapted to carry the high voltage AC power and being connected to the high-voltage AC electrical connections for each of the plurality of repeating blocks; and
    a transparent, flexible, electrically insulative covering around the printed circuit board and the pair of conductors, the covering providing a separate, electrically-insulated space for each of the pair of conductors.

2. The strip of linear lighting of claim 1, further comprising one or both of a ballast resistor or a current controller.

3. The strip of linear lighting of claim 1, wherein the power conversion and conditioning circuit further comprises a constant current controller.

4. The strip of linear lighting of claim 1, wherein the printed circuit board comprises Mylar.

5. The strip of linear lighting of claim 1, wherein the pair of conductors is separate from and adjacent to the PCB.

6. The strip of linear lighting of claim 1, wherein the filter comprises a plurality of filters, each of the plurality of filters connected in parallel with one of the plurality of LED light engines.

7. The strip of linear lighting of claim 6, wherein each of the plurality of filters comprises a capacitor in parallel with a resistor.

8. The strip of linear lighting of claim 7, wherein the capacitor comprises a tantalum capacitor.

9. The strip of linear lighting of claim 1, wherein the filter comprises a capacitor.

10. The strip of linear lighting of claim 9, wherein the filter comprises a tantalum capacitor.

11. The strip of linear lighting of claim 1, wherein each repeating block further comprises a transient voltage suppression diode.

12. The strip of linear lighting of claim 11, wherein the transient voltage suppression diode is electrically disposed between the electrical connections and the power conversion and conditioning circuit.

13. The strip of linear lighting of claim 1, wherein the filter comprises at least one active device.

14. The strip of linear lighting of claim 13, wherein the active device comprises a capacitance multiplier.

* * * * *